(12) United States Patent
Tubert

(10) Patent No.: US 10,580,809 B2
(45) Date of Patent: Mar. 3, 2020

(54) IMAGE SENSOR WITH IMPROVED SETTLING TIME

(71) Applicant: STMicroelectronics (Grenoble 2) SAS, Grenoble (FR)

(72) Inventor: Cedric Tubert, Saint-Egreve (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 394 days.

(21) Appl. No.: 15/372,017

(22) Filed: Dec. 7, 2016

(65) Prior Publication Data

US 2018/0158854 A1 Jun. 7, 2018

(51) Int. Cl.
*H01L 27/146* (2006.01)

(52) U.S. Cl.
CPC .............. *H01L 27/14612* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,345,269 | B2 * | 3/2008 | Lee ...................... | H04N 5/3658 250/208.1 |
| 9,706,147 | B2 * | 7/2017 | Tubert ............... | H01L 27/14641 |
| 9,736,413 | B1 * | 8/2017 | Ayers ................ | H01L 27/14612 |
| 2001/0010551 | A1 * | 8/2001 | Dierickx .............. | H04N 5/3575 348/241 |
| 2005/0243193 | A1 * | 11/2005 | Gove .................... | H04N 5/3575 348/241 |
| 2008/0143860 | A1 * | 6/2008 | Sato ....................... | H04N 5/335 348/301 |
| 2009/0033532 | A1 * | 2/2009 | Reshef ................. | H03M 1/123 341/137 |
| 2009/0272879 | A1 * | 11/2009 | Dai ...................... | H04N 5/3559 250/208.1 |
| 2010/0020217 | A1 * | 1/2010 | Abe ..................... | H04N 5/3591 348/308 |
| 2010/0110256 | A1 * | 5/2010 | Jung .................... | H04N 5/3741 348/308 |
| 2011/0019053 | A1 * | 1/2011 | Nishihara .............. | H04N 5/357 348/311 |
| 2011/0216232 | A1 * | 9/2011 | Koifman ................ | H04N 5/363 348/294 |
| 2011/0267522 | A1 * | 11/2011 | Gendai .................. | H04N 5/335 348/308 |
| 2012/0012736 | A1 * | 1/2012 | Simony ................ | H04N 5/3745 250/208.1 |
| 2012/0133800 | A1 * | 5/2012 | Jung .................... | H04N 5/3575 348/241 |
| 2013/0020466 | A1 * | 1/2013 | Ayers ................ | H01L 27/14609 250/208.1 |

(Continued)

*Primary Examiner* — John R Lee
(74) *Attorney, Agent, or Firm* — Slater Matsil, LLP

(57) ABSTRACT

A circuit includes a pixel structure having a photo sensitive element and a read transistor. The read transistor includes a first load path terminal coupled to the photo sensitive element, and a second load path terminal coupled to a voltage bus. The circuit also includes a first transistor having a third load path terminal coupled to a power supply node, and a fourth load path terminal configured to be coupled to a current source. The circuit further includes a first control switch coupled between the voltage bus and the fourth load path terminal of the first transistor.

21 Claims, 4 Drawing Sheets

(56) References Cited

U.S. PATENT DOCUMENTS

| | | | |
|---|---|---|---|
| 2013/0119235 A1* | 5/2013 | Iida | H04N 5/3575 250/208.1 |
| 2014/0103197 A1* | 4/2014 | Tubert | H04N 5/35581 250/214 P |
| 2014/0124654 A1* | 5/2014 | Nishikido | H04N 5/3597 250/208.1 |
| 2015/0055002 A1* | 2/2015 | Beck | H04N 5/3559 348/308 |
| 2015/0077605 A1* | 3/2015 | Takada | H01L 27/148 348/300 |
| 2015/0136953 A1* | 5/2015 | Kim | H04N 5/3575 250/208.1 |
| 2015/0208008 A1* | 7/2015 | Gendai | H04N 5/3698 250/208.1 |
| 2015/0215559 A1* | 7/2015 | Tubert | H01L 27/14641 348/308 |
| 2015/0222836 A1* | 8/2015 | Wada | H04N 5/378 348/222.1 |
| 2015/0237285 A1* | 8/2015 | Tanaka | H04N 5/3745 348/300 |
| 2015/0312506 A1* | 10/2015 | Okura | H04N 5/37457 250/208.1 |
| 2016/0198108 A1* | 7/2016 | Guidash | H04N 5/35554 348/308 |
| 2016/0301889 A1* | 10/2016 | Kato | H04N 5/3575 |
| 2016/0370224 A1* | 12/2016 | Liu | H01L 27/14601 |
| 2017/0085820 A1* | 3/2017 | Inada | H03M 1/08 |
| 2018/0158854 A1* | 6/2018 | Tubert | H01L 27/14612 |
| 2019/0052826 A1* | 2/2019 | Ogawa | H04N 5/374 |
| 2019/0058838 A1* | 2/2019 | Funamizu | H04N 5/379 |
| 2019/0082126 A1* | 3/2019 | Hisamatsu | H03M 1/56 |

* cited by examiner

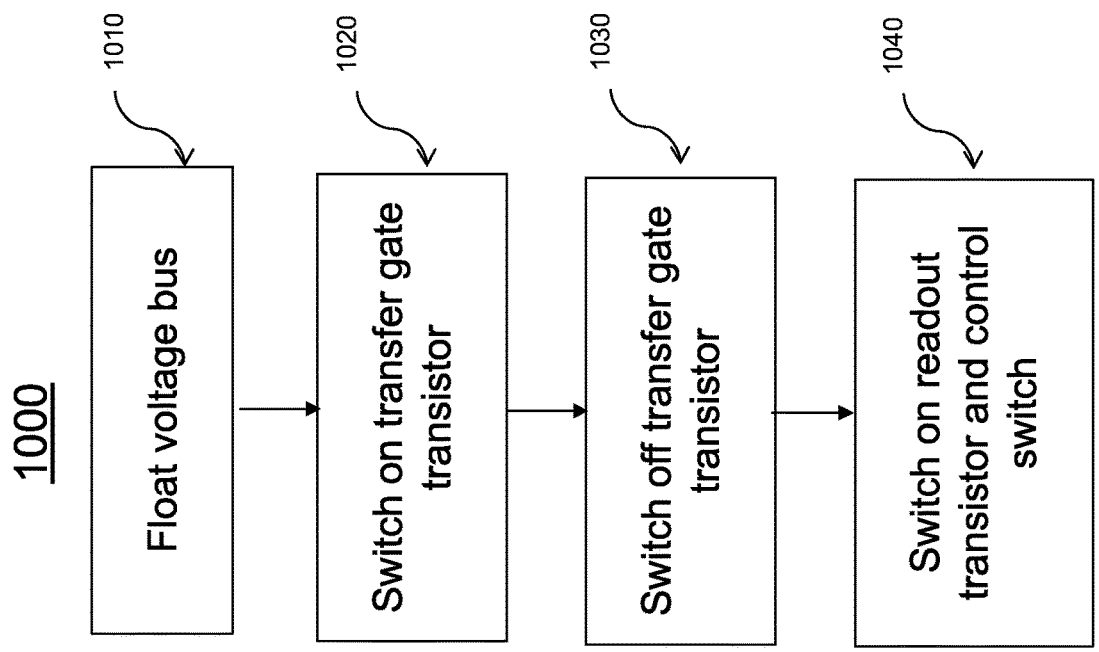

IMAGE SENSOR WITH IMPROVED
SETTLING TIME

TECHNICAL FIELD

The present disclosure relates to integrated circuit and, in particular embodiments, to methods and circuits for digital image sensors.

BACKGROUND

An image sensor is a device which senses light of an optical image and then converts the optical image into electrical signals. Image sensors have evolved from video camera tubes to Charge-Coupled Devices (CCDs) and Complementary Metal-Oxide Semiconductor (CMOS) devices. CCD and CMOS image sensors are widely used in various applications such as consumer electronics (e.g., digital single-lens reflex (DSLR) cameras, cameras for mobile telephones, webcams and optical mice) and industrial applications (e.g., machine vision, security surveillance, automotive safety and control).

CCDs have historically been the choice for image sensors in high performance digital cameras because they were able to achieve higher noise performance, with a lower dark current than their CMOS counterparts. However, recent advancements in CMOS noise performance have enabled CMOS image sensors to become prominent in high performance cameras.

CMOS image sensors are made up of an array of pixels. Each pixel, also referred to as a pixel structure, has a photo detector which converts light energy into electrical charge. The electrical charge is then transferred and converted into a voltage signal using the transistors in the pixel structure. The voltage signal is then converted into digital signal by an analog-to-digital converter (ADC) in the read circuit of the image sensor.

SUMMARY

In accordance with various embodiments, a circuit includes a pixel structure having a photo sensitive element and a read transistor. The read transistor includes a first load path terminal coupled to the photo sensitive element, and a second load path terminal coupled to a voltage bus. The circuit also includes a first transistor having a third load path terminal coupled to a power supply node, and a fourth load path terminal configured to be coupled to a current source. The circuit further includes a first control switch coupled between the voltage bus and the fourth load path terminal of the first transistor.

BRIEF DESCRIPTION OF THE DRAWINGS

Others advantages and features of the invention will become apparent upon detailed examination of non-limiting embodiments and their implementation and from the appended drawings in which:

FIG. 4 illustrates a flow chart of a method of operating a circuit, in various embodiments.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, circuits for image sensors and methods of operating the circuits.

In accordance with an embodiment of the present disclosure, a circuit includes a voltage bus coupled to a pixel. The voltage bus is also coupled to an auxiliary circuit via a control transistor. The auxiliary circuit includes a first transistor coupled between a power supply node and a current source. A node between the first transistor and the current source is coupled to the control transistor. In an embodiment method of operating the circuit, the voltage bus is floated by switching off the control transistor and a read transistor of the pixel. While the voltage bus is floating, a transfer gate transistor of the pixel is turned on then turned off to allow electrons accumulated at the photo-sensitive element to flow to a floating diffusion of the pixel. After the transfer gate transistor is turned off, the control transistor and the read transistor are turned on.

Figure 1:
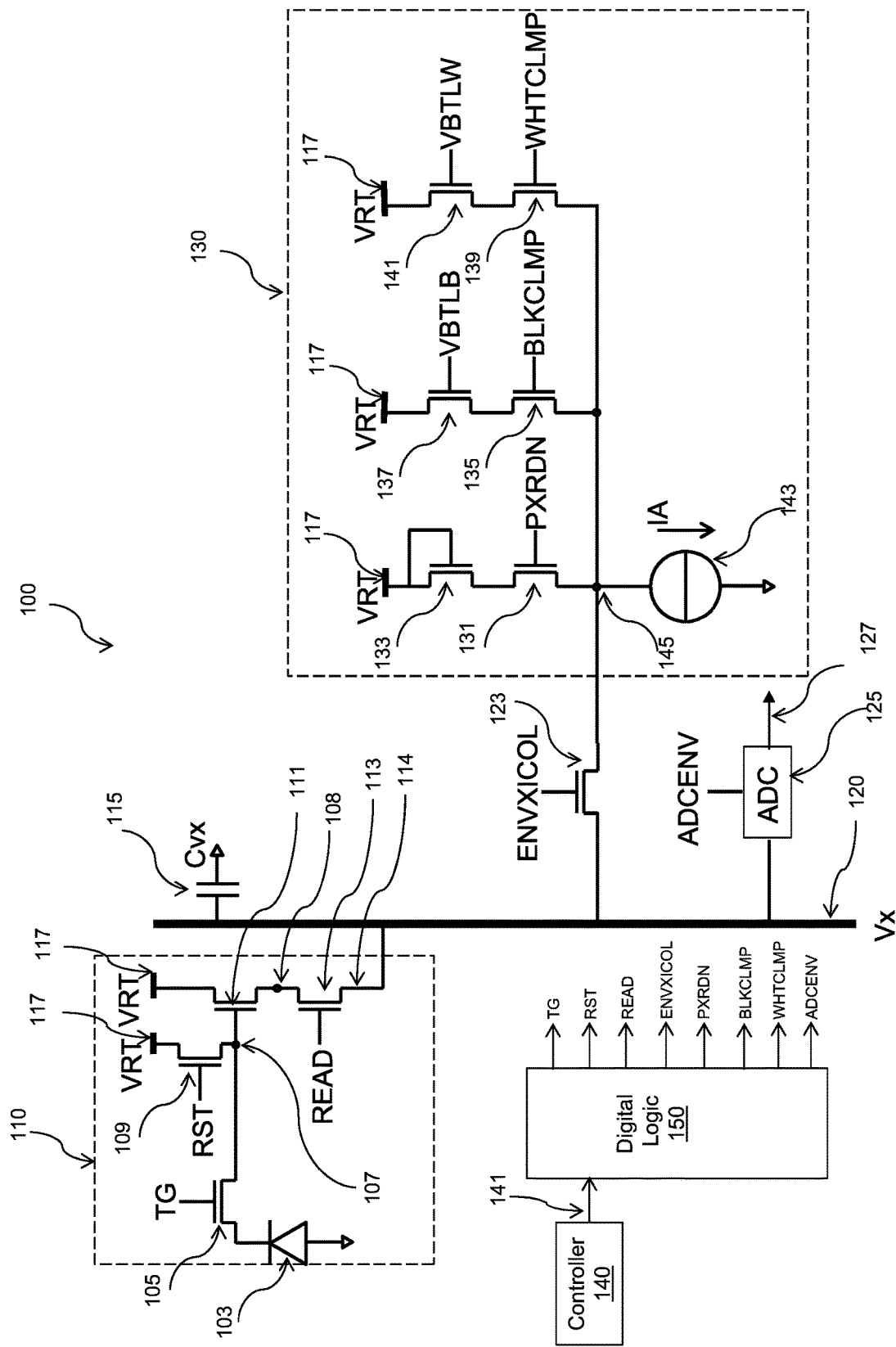
FIG. 1 illustrates a schematic view of a circuit showing a portion of an image sensor, in some embodiments.

FIG. 1 illustrates a circuit 100, which is a portion of an image sensor such as a CMOS image sensor. As illustrated in FIG. 1, circuit 100 has a pixel no coupled to a voltage bus 120, and an auxiliary circuit 130 coupled to voltage bus 120 via a control transistor 123. Auxiliary circuit 130 assists with the readout of the voltage Vx on voltage bus 120, and improves the accuracy and/or speed of the conversion of voltage Vx into digital signal, in some embodiments. In the illustrated embodiment, auxiliary circuit 130 includes a current source 143, a precharge circuit comprised of transistors 131/133, a black clamp circuit comprised of transistors 135/137, and a white clamp circuit comprised of transistors 139/141. Circuit 100 also includes an ADC 125 coupled to voltage bus 120, a controller 140 and a digital logic unit 150, in various embodiments.

Referring to FIG. 1, pixel 110, also referred to as a pixel structure, includes four transistors 105/109/111/113 and a photo-sensitive element 103. Photo-sensitive element 103 is a photodiode, such as a pinned photodiode in some embodiments. Photo-sensitive element 103 converts light into an electrical current and/or an electrical charge (e.g., a voltage). In the discussion hereinafter, photo-sensitive element 103 may be referred to as photodiode 103, with the understanding that any suitable photo-sensitive element may be used. The four transistors of pixel no are transfer gate transistor 105, reset transistor 109, source follower transistor 111, and read transistor 113. Each of the four transistors may be a metal-oxide-semiconductor field-effect transistor (MOSFET), as an example. Since pixel no has four transistors, it is sometimes referred to as a 4T (where T stands for transistor) pixel.

As illustrated in FIG. 1, transfer gate transistor 105 is coupled between photo-sensitive element 103 and node 107 (also referred to as floating diffusion 107). The gate of transfer gate transistor 105 is controlled by a control signal TG. Reset transistor 109 is coupled between floating diffusion 107 and a power supply node 117, which is coupled to a power supply (not shown) having a voltage VRT. The gate of reset transistor 109 is controlled by a control signal RST. In FIG. 1, source follower transistor 111 is coupled between power supply node 117 and read transistor 113. In particular, a first load path terminal (e.g., a drain) of source follower transistor 111 is coupled to power supply node 117, and a second load path terminal (e.g., a source) of source follower transistor 111 is coupled to node 108. In the discussion herein, a load path terminal refers to the drain or the source of a transistor.

As illustrated in FIG. 1, the gate of source follower transistor 111 is coupled to floating diffusion 107. A first load path terminal (e.g., a drain) of read transistor 113 is coupled to node 108, and a second load path terminal 114 (e.g., a source) of read transistor 113 is coupled to voltage bus 120. The gate of read transistor 113 is controlled by a control signal READ. Also illustrated in FIG. 1 is the parasitic capacitance Cvx of voltage bus 120. The parasitic capacitance Cvx is in the range of a few pF, such as between about 1 pF and about 2 pF, in some embodiments, although other values are also possible.

When transfer gate transistor 105 is turned on, the accumulated charge in photodiode 103 is transferred to floating diffusion 107 as a voltage level. Transistor 111 acts as a source follower, and therefore, source follower transistor 111 buffers the voltage at its gate (e.g., voltage at floating diffusion 107), and outputs a voltage at node 108. The voltage at node 108 is lower than the gate voltage of source follower transistor 111 by Vgs, where Vgs is the gate-source voltage of source follower transistor 111, in some embodiments. The Vgs of source follower transistor 111 depends on current source 143. In some embodiments, there is a small attenuation of the AC variations due to a bulk effect on source follower transistor 111. When read transistor 113 is turned on, node 108 is coupled to voltage bus 120, and therefore, voltage Vx on voltage bus 120 is equal to the voltage at floating diffusion 107 down shifted by Vgs of source follower transistor 111, in some embodiments. Reset transistor 109, when turned on with transfer gate transistor 105, resets photodiode 103, e.g., to prepare for a new processing cycle, in some embodiments. In the discussion herein, a transistor is turned on when appropriate gate voltage is applied such that an electrically conductive path with low electrical resistance is formed between the source and the drain of the transistor, and such that the voltage at the source is substantially the same as the voltage at the drain, in some embodiments. For example, in embodiments where transistors of circuit 100 are n-type MOSFETs, a logic high voltage may be applied at the gate of the transistor to turn the transistors on.

The precharge circuit includes transistor 131 (may also be referred to as a first transistor) and transistor 133, where transistor 131 is coupled to power supply node 117 via transistor 133. In the example of FIG. 1, the gate and a first load path terminal (e.g., a drain) of transistor 133 are coupled together to form a transistor 133 in diode configuration. Transistor 131 is coupled between transistor 133 and current source 143. Node 145, which is coupled to transistor 131 and current source 145, is coupled to voltage bus 120 via control transistor 123. The gate of control transistor 123 is controlled by a control signal ENVXICOL, and the gate of transistor 131 is controlled by a control signal PXRDN, in some embodiments. In some embodiments, the current IA of current source 143 is between about 1 µA and about 3 µA, although other suitable values may also be possible.

When transistor 131 in the precharge circuit is turned on (e.g., by control signal PXRDN), the precharge circuit allows voltage bus 120 to be precharged to a voltage level that is equal to or close to a mean pixel reset voltage (e.g., the expected average voltage after pixel is reset) of voltage bus 120. This advantageously reduces the settling time of the image sensor, as discussed in more detail hereinafter. In addition, the precharge circuit may act as an anti-floating device to reduce electrical ground bouncing and power supply voltage VRT bouncing. To understand the effect of the precharge circuit, consider the time interval when no pixel is being addressed (e.g., after sampling of one pixel has finished and before another pixel is selected), if transistor 131 is turned off, the current source 145 will be switched off and consequently, there is no current flowing between the power supply (e.g., power supply at node 117) and the ground of the pixel. When the next pixel is selected (e.g., addressed), current starts flowing between the power supply and the ground of the pixel. Therefore, with the switching of different pixels, current flow will be turned on and off frequently, which will cause bouncing of the ground and power supply. By turning on transistor 131 during the time interval when no pixel is selected, the precharge circuit allows for continuous current flow between the pixel ground and the power supply at all times, thus avoiding the bouncing of the ground and the power supply.

The black clamp circuit includes transistor 135 and transistor 137. A first load path terminal (e.g., a drain) of transistor 135 is coupled to power supply node 117 via transistor 137, and a second load path terminal (e.g., a source) of transistor 135 is coupled to node 145. The gate of transistor 135 is controlled by control signal BLKCLMP, and the gate of transistor 137 is supplied with a voltage VBTLB which defines the voltage level of the black clamp on voltage bus 120. The black clamp circuit may be used to handle the "dark sun effect" of image sensors. In CMOS image sensors, a bright spot in the scene may appear as a dark spot in the digital image, which may be referred to as the dark sun effect. The black clamp circuit may be used to avoid or reduce the dark sun effect. Methods and circuits for removing the dark sun effect are known in the art and are disclosed in, e.g., U.S. Patent Pub. No. 2004/0155973.

The white clamp circuit includes transistor 139 and transistor 141 coupled in series between power supply node 117 and node 145, similar to transistors 135/137 in the black clamp circuit. The gate of transistor 139 is controlled by control signal WHTCLMP, and the gate of transistor 139 is supplied with a voltage VBTLW which defines the voltage level of the white clamp on voltage bus 120. The white clamp circuit is used to clamp the white level in high light condition to avoid saturation of voltage Vx on voltage bus 120, and to avoid the need to switch off current source 143 due to the saturation of Vx. Since turning off current source 143 may cause bounding of the ground and power supply, white clamp circuit acts as a safety circuit to avoid switching off the current source 143. In some embodiments, transistor 139 is always turned on during operation (e.g., control signal WHTCLMP is high for an n-type MOSEFT). In other embodiments, transistor 139 of the white clamp circuit may be turned on only around the second conversion period 213 (see FIG. 2), e.g., between time $T_5$ and time $T_7$ in FIG. 2. In some embodiments, at least one of the precharge circuit, the black clamp circuit, and the white clamp circuit is turned on during operation of the image sensor. As discussed above, each of the precharge circuit, the black clamp circuit, and the white clamp circuit, when turned on, may act as an anti-floating device.

As illustrated in FIG. 1, an ADC 125 is coupled to voltage bus 120 and converts the analog voltage Vx on voltage bus 120 into digital signal 127. ADC 125 may have a control signal, e.g., an enable signal ADCENV, which is used to control when ADC 125 operates to convert voltage Vx into a digital value.

FIG. 1 further illustrates a controller 140 and a digital logic unit 150. Controller 140 might be a micro-controller, a central processing unit (CPU), an application-specific integrated circuit (ASIC), or any other appropriate type of controllers. In embodiments where controller 140 is a micro-controller or CPU, controller 140 may have a memory (e.g., a non-volatile memory) that stores instructions (e.g., computer executable code) which, when executed by controller 140, generate control signals at output port 141 of controller 140. In embodiments where controller 140 is an ASIC, controller 140 may have hardware functional blocks with programmable control parameters that generate control signals at output port 141. Digital logic unit 150 includes circuits that are configured to, based on the control signal from controller 140, generate various control signals for controlling the operation of, e.g., the various transistors of circuit 100 and ADC 125. For example, digital logic unit 150 may be or include a decoder circuit that decodes the control signal from controller 141, and generates various control signals and enable signals (e.g., TG, RST, READ, ENVXICOL, PXRDN, BLKCLMP, WHTCLMP, ADCENV). The gate control signals and the enable signals may be coupled to the respective control gates or enable terminals (e.g., TG, RST, READ, ENVXICOL, PXRDN, BLKCLMP, WHTCLMP, ADCENV) via electrically conductive paths (not shown) such as copper lines or control signal bus, as examples.

In some embodiments, digital logic unit 150 is integrated with pixel 110, auxiliary circuit 130, voltage bus 120, and control transistor 123 in a same integrated circuit (IC) such as an integrated CMOS sensor device. In addition, digital logic unit 150 may be integrated with controller 140 for higher level of integration, and the integrated controller 140 and digital logic unit 150 may be integrated with pixel 110, auxiliary circuit 130, voltage bus 120, and control transistor 123 in a same IC such as an integrated CMOS sensor device. Similarly, ADC 125 may be integrated in the integrated CMOS sensor device.

Figure 2:
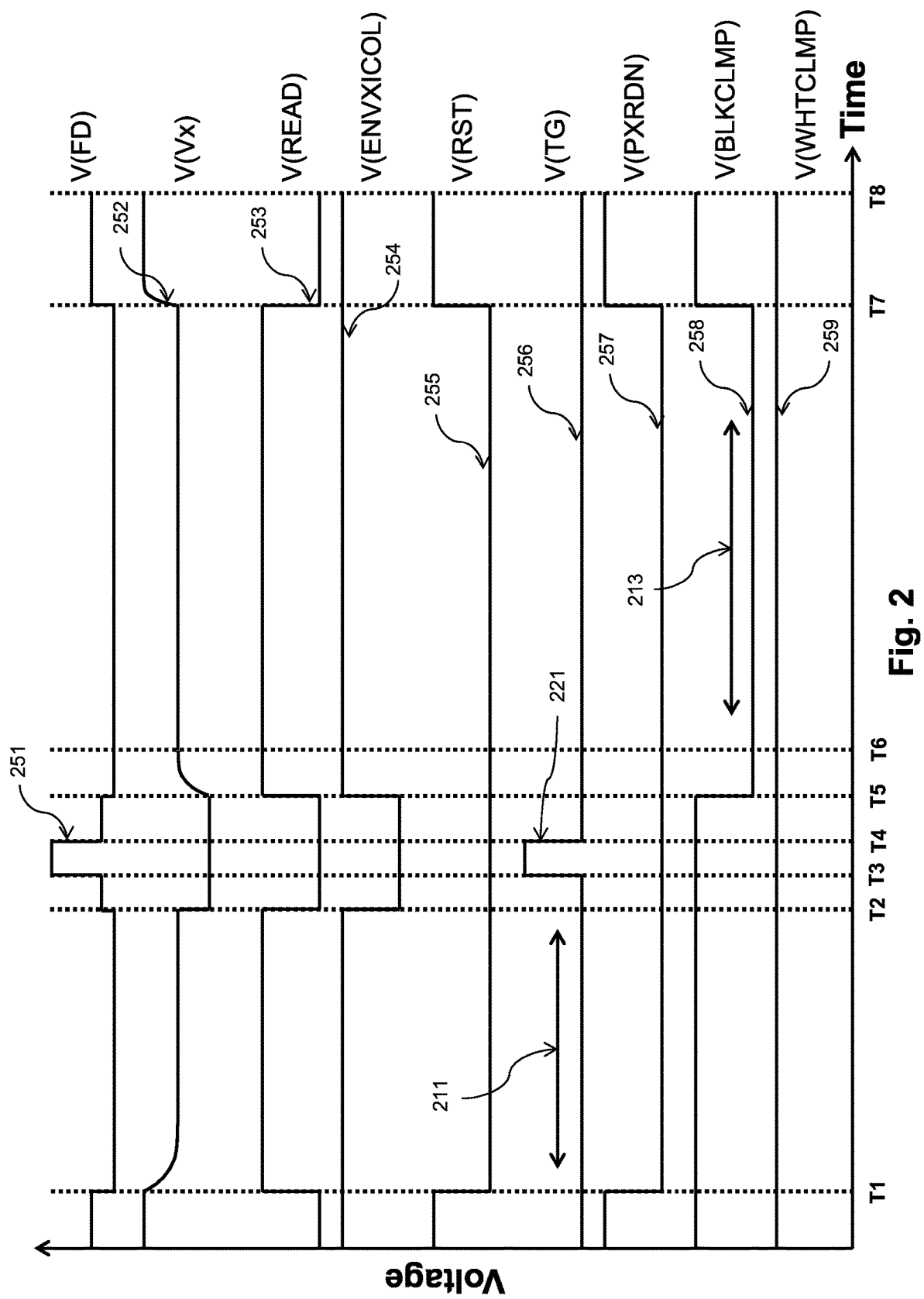
FIG. 2 illustrates a timing diagram for the circuit of FIG. 1, in some embodiments.

FIG. 2 shows a simulated timing diagram for circuit 100 of FIG. 1, in some embodiments. In FIG. 2, the X-axis illustrates time t, and the Y-axis illustrates the amplitude (e.g., voltage) of the respective signal. Curve 251 illustrates voltage V(FD) which corresponds to the voltage at floating diffusion 107. Curve 252 illustrates voltage V(Vx) which corresponds to voltage Vx on voltage bus 120. Curve 253 illustrates voltage V(READ), which corresponds to the voltage of control signal READ at the gate of read transistor 113. Curve 254 illustrates voltage V(ENVXICOL), which corresponds to the voltage of control signal ENVXICOL at the gate of control transistor 123. Curve 255 and curve 256 illustrate voltages V(RST) and V(TG), respectively, where V(RST) and V(TG) correspond to the voltages of control signals RST and TG, respectively. Curve 257 illustrates voltage V(PXRDN) that corresponds to the voltage of control signal PXRDN, curve 258 illustrates voltage V(BLKCLMP) that corresponds to the voltage of control signal BLKCLMP, and curve 259 illustrates voltage V(WHTCLMP) that corresponds to the voltage of control signal WHTCLMP.

Referring to FIG. 2, the time interval between time T1 to time T8 corresponds to a processing cycle during which the output of pixel 110 is converted to a digital signal by ADC 125. At the end of the last processing cycle (e.g., right before time T1), control voltages V(ENVXICOL), V(RST), V(PXRDN), V(BLKCMP) and V(WHTCLMP) are high, and control voltages V(TG) and V(READ) are low. In the example of FIG. 2, V(WHTCLMP) remains high during operation of the image sensor.

At time T1, control signal RST is switched from high to low to turn off reset transistor 109, such that pixel no gets out of the RESET state in preparation for a new processing cycle. Also at time T1, control signal READ is switched from low to high to turn on read transistor 113, thus coupling the output (e.g., voltage at node 108) of source follower transistor 111 to voltage bus 120. The switching on of read transistor 113 at time T1 causes a small drop (e.g., between about 0.1 V to about 0.2 V) of V(FD) and some voltage transient of V(Vx) around time T1. In addition, V(PXRDN) is switched from high to low at time T1, as illustrated in FIG. 2.

Next, during time period 211, a first measurement of pixel no is performed. The first measurement involves converting a first voltage on voltage bus 120 into a first digital value using ADC 125. The ADC enable signal ADCENV is active during time period 211 to enable the operation of ADC, in some embodiments. The first measurement is used with a second measurement discussed hereinafter in a correlated double sampling (CDS) method, in various embodiments.

Correlated double sampling (CDS) is a method to measure electrical signals (e.g., voltages or currents) that allows for the removal of an offset in the measured electrical signal. CDS is often used in measuring sensor output, where the output of the sensor is measured twice. The difference between a first measurement and a second measurement generates a value with a known relation to the physical quantity being measured. In CMOS image sensors, the second measurement (SIG) is then subtracted from the first measurement (REF). In the illustrated embodiment, the first measurement performed during time period 211 corresponds to black level (e.g., kTC noise, pixel charge injection and pixel Vgs voltage of transistor 111) of pixel no, and the second measurement performed during time period 213 corresponds to the black level minus the image signal at pixel no. Black level may exhibits significant variations from pixel to pixel, and these variations should be removed to achieve an acceptable image quality. By subtracting the second measurement from the first measurement, black level is removed from converted pixel output.

Next, at time T2, control voltages V(READ) and V(ENVXICOL) are switched from high to low, and the corresponding transistors 113/123 are turned off. Turning off read transistors 113 and control transistor 123 decouples voltage bus 120 from node 108 (output of source follower transistor 111) of pixel no and node 145 of auxiliary circuit 130, thus leaving voltage bus 120 "floating." In the simulation of FIG. 2, voltage bus 120 remains floating until time T5, when control voltages V(READ) and V(ENVXICOL) are switched from low to high. Note that although voltage bus 120 is floating between time T2 and time T5, read transistors 113 and parasitic capacitance Cvx act as a sample-and-hold circuit that, during the short time interval (e.g., between about 200 ns to about 1 μs) between time T2 and time T5, tries to hold voltage Vx on voltage bus 120 at the voltage level obtained right before time T2.

The pixel operating point (e.g., voltage Vx) may vary significantly (e.g., +/−150 mV or more) from pixel to pixel. The presently disclosed method samples the operating point of the addressed pixel before voltage bus 120 becomes floating, and holds the sampled value of the operating point. This allows Vx to recover from the same operating point after voltage bus 120 gets out of the state of floating (e.g., at time T5), thus avoiding a large (e.g., +/−150 mV) voltage difference for Vx to recover after voltage bus 120 gets out of a floating state, which advantageously reduces the settling time. The small voltage variations (e.g., +/−10 mV depending on various factors such as process condition, voltage, and temperature) of V(Vx) around time T2 and time T5, shown in FIG. 2, are due to the charge injection when control transistor 123 and read transistor 113 are turned on or off. The small voltage variations of voltage bus 120 in the present disclosure may be orders of magnitude smaller than those of conventional image sensors and may advantageously reduce the settling time of the image sensor, especially for dark pixels, as described in details hereinafter.

Next, after transistors 113/123 are turned off at time T2, transfer gate transistor 105 is turned on for a short interval of time between time T3 and time T4, and the corresponding voltage V(TG) shows a TG pulse 221 between time T3 and time T4. For example, transfer gate transistor 105 is turned on at time T3, and subsequently, transfer gate transistor 105 is turned off at time T4. During time T3 and time T4, electrons from the photodiode 103 are transferred to floating diffusion 107. Therefore, the time interval between time T3 and T4 (also referred to as TG pulse width) are selected to allow for transfer of substantially 100% of the electrons accumulated at photodiode 103 to floating diffusion 107, in some embodiments. The TG pulse width may depend on various factors such as the technology used to fabricate the photodiode, the specific type of photodiode used (e.g., planar photodiode, photodiode with storage in volume, 3D integrated photodiode), the size of the photodiode, operating voltage and/or temperature, as examples. For example, TG pulse width may be chosen such that the lag performance of the pinned photodiode leads to zero electron regardless of the process, voltage and temperature conditions. In some embodiments, TG pulse width is between a few ns and about 500 ns.

Next, after transfer gate transistor 105 is tuned off, control voltages V(READ) and V(ENVXICOL) are switched from low to high at time T5, and control voltage V(BLKCLMP) is switched from high to low at time T5. Switching on read transistor 113 and control transistor 123 couples voltage bus 120 to pixel no and auxiliary circuit 130, thus voltage bus 120 gets out of the "floating" state. The voltage Vx on voltage bus 120 changes from a voltage held while voltage bus 120 was floating (e.g., between time T2 and time T5) to the voltage at node 108, which is the voltage to be measured. As illustrated in FIG. 2, it takes a while for voltage V(Vx) to settle to a stable value at time T6. The time interval between time T4 (when transfer gate transistor 105 is turned off) and time T6 is referred to as the settling time of the image sensor. In some embodiments, the settling time is between about 50 ns to about 500 ns. A small settling time may indicate that ADC 125 has to wait for less amount of time after TG pulse 221 ends at time T4, before converting the output (e.g., Vx) of pixel no into digital signal. For image sensors with millions of pixels, reducing the settling time may drastically improve the image capturing time and frame rate of image sensors. For image sensors using ramp ADCs, the reduction of settling time is particularly beneficial for the conversion of dark pixels. During the operation of ramp ADCs, conversion of dark pixels finishes early during the second measurement period 213, due to the small voltage values of dark pixels. Therefore, a smaller settling time means conversion period 213 for dark pixels may start earlier after TG pulse 221 ends at time T4. The benefit for white pixels might be less than that of dark pixels in a ramp ADC, because white pixels take longer to convert in a ramp ADC, therefore conversion of white pixels might begin before Vx completely settles down after TG pulse 221.

As discussed above, the present disclosure turns on and off transfer gate transistor 105 while voltage bus 120 is floating, therefore, disturbance of voltage Vx due to the transfer of electrons from photodiode 103 to floating diffusion 107 is avoided or reduced. Recall that due to the sample-and-hold effect provided by read transistor 113 and parasitic capacitance Cvx while voltage bus 120 is floating, voltage bus 120 may hold the value of Vx to the value obtained right before voltage bus 120 becomes floating. This, combined with the fact that disturbance of voltage Vx is reduced, allows voltage Vx on voltage bus 120 to quickly settle or converge to a stable value at time T6. As a result of the small voltage difference to recover, the settling time is shortened. Furthermore, without being limited to a particular theory of operation, it is believed that the settling time is proportional to the variations of the gate-source voltages of source follower transistor 111 and transistor 131 caused by TG pulse 221 (e.g., turning on and off transfer gate transistor 105). By turning off read transistor 113 and control transistor 123, variations of the gate-source voltages of transistors 111/131 due to TG pulse 221 are reduced, further improving the settling time.

Next, after time T6, a second measurement of voltage Vx, which corresponds to the output of pixel 110, is made by ADC 125 during time period 213. Controller 140 may generate the enable signal ADCENV during time period 213 for the operation of ADC 125. The second measured value (also referred to as SIG sample) of Vx during time interval 213 is subtracted from the first measured value (also referred to as REF sample) of Vx during time interval 211 to obtain the output of image sensor 100, as discussed above for a CDS method, in some embodiments.

The ADC conversion time (e.g., time interval 211 or 213) for the first measurement and the second measurement depends on the structure of the ADC and the resolution of the ADC, in some embodiments. As an example, consider the case where a continuous time ADC such as a continuous time sigma delta modulator is used as ADC 125, conversion time 211 and 213 may be the same, and may depends on the ADC resolution (e.g., 10-bit, 12-bit, or 14-bit). As another example, when a continuous time ADC such as a Ramp ADC is used as ADC 125, conversion time 213 is longer than conversion time 211, which may be due to that signals corresponding to SIG samples have more variations that signals corresponding to REF sample.

Next, at time T7, control voltages V(READ) is switched from high to low, and control voltages V(RST), V(PXRDN) and V(BLKCLMP) are switched from low to high. Pixel no is reset and ready for the next processing cycle.

Figure 3:
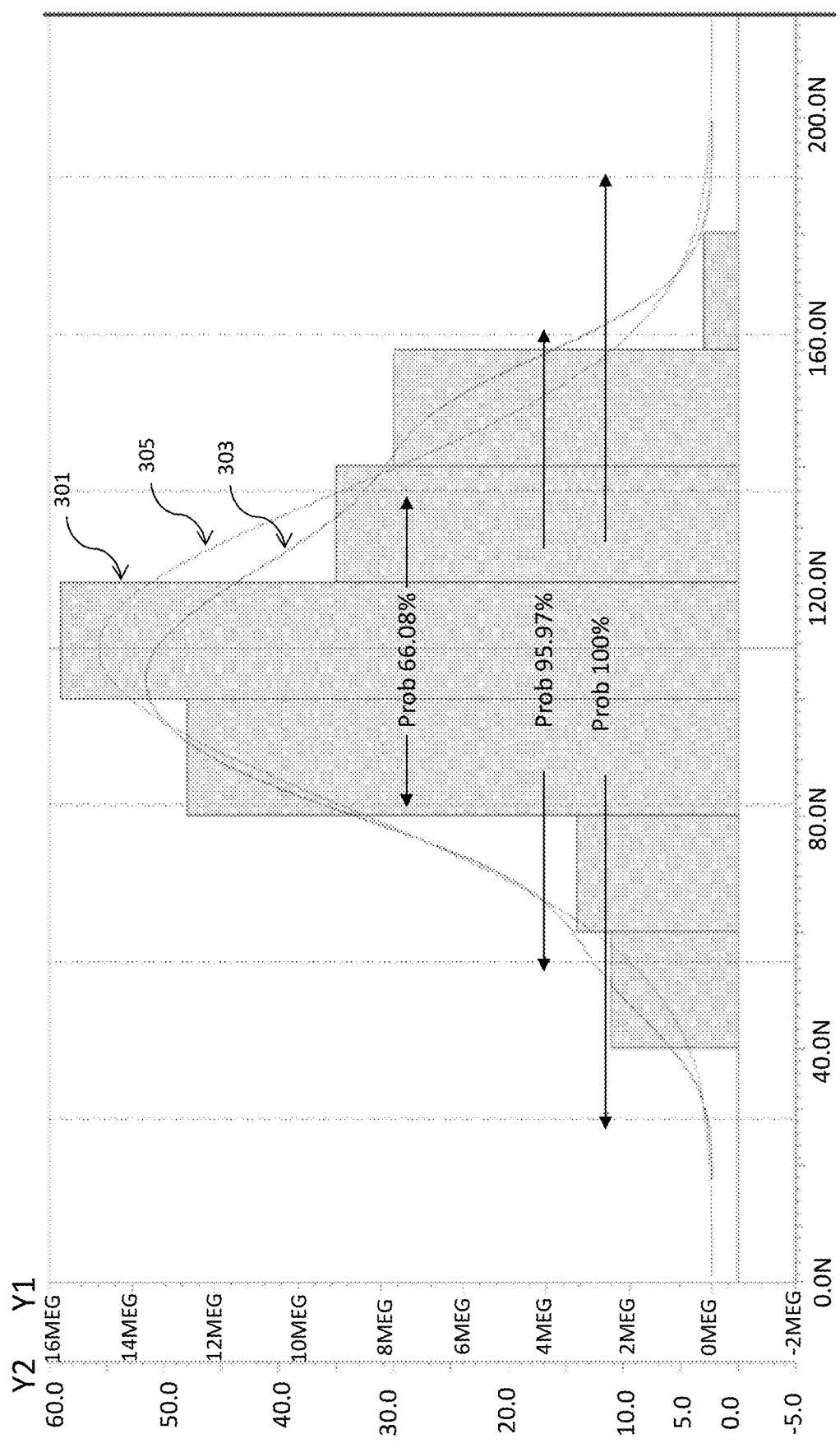
FIG. 3 illustrates the spatial distribution of the residual column offset after correlated double sampling (CDS) of the circuit of FIG. 1, in some embodiments.

FIG. 3 illustrates the performance of circuit 100 of FIG. 1. In particular, FIG. 3 shows a histogram 301 for the residual column offset after CDS (also referred to as vertical fixed pattern noise (VFPN)) of circuit 100. Additionally, curve 303 shows the probability distribution function (PDF) of the VFPN of circuit 100, and curve 305 shows a Gaussian distribution having the same mean and standard deviation as the PDF shown by curve 303. For evaluation and comparison of the performance of image sensors, the root-mean-square (RMS) deviation of the VFPN is used frequently. The RMS deviation for the circuit 100 in FIG. 1 is about 26.96 nV. In comparison, a conventional image sensor may have a large RMS deviation of about 1000 nV. The small RMS deviation (e.g., 26.96 nV) indicates performance of circuit 100 is not affected by the new timing sequence (e.g., FIG. 2) of the present disclosure.

FIG. 4 illustrates a flow chart of a method of operating a circuit, in accordance with some embodiments. It should be understood that the embodiment method shown in FIG. 4 is merely an example of many possible embodiment methods. One of ordinary skill in the art would recognize many variations, alternatives, and modifications. For example, various steps as illustrated in FIG. 4 may be added, removed, replaced, rearranged and repeated.

Referring to FIG. 4, at step 1010, a voltage bus is floated. The voltage bus is coupled to a pixel, and is coupled to a current source via a first control switch. The first control switch may be a transistor, as an example. A first node coupled to the current source and the first control switch is coupled to a power supply node via a first transistor. The pixel includes a photo sensitive element coupled to a drain of a transfer gate transistor, a source follower transistor having a gate coupled to a source of the transfer gate transistor, and a drain coupled to the power supply node. The pixel also includes a read transistor having a drain coupled to a source of the source follower transistor, and a source coupled to the voltage bus. The floating of the voltage bus includes switching off the read transistor and the first control switch. At step 1020, while the voltage bus is floating, the transfer gate transistor is switched on. At step 1030, while the voltage bus is floating, the transfer gate transistor is switched off after the switching on the transfer gate transistor. At step 1040, the read transistor and the first control switch are switched on after the switching off the transfer gate transistor.

Advantages of embodiments of the present invention include shorter (e.g., less than about 500 ns) settling time for image sensors. The short settling time allows for quick image capture by the image sensor. For modern image sensors with millions of pixels, short settling time of each pixel may drastically improve image capture time, thus improving the performance of the imaging devices (e.g., digital SLR cameras, cell phone cameras) and user experience. Simulation also indicates no degradation of the VPFN performance for the presently disclosed image sensor.

In some embodiments, a circuit includes a pixel structure having a photo sensitive element and a read transistor. The read transistor includes a first load path terminal coupled to the photo sensitive element, and a second load path terminal coupled to a voltage bus. The circuit also includes a first transistor having a third load path terminal coupled to a power supply node, and a fourth load path terminal configured to be coupled to a current source. The circuit further includes a first control switch coupled between the voltage bus and the fourth load path terminal of the first transistor.

In other embodiments, an image sensor includes a pixel. The pixel includes a photodiode, a transfer gate transistor coupled between the photodiode and a floating diffusion, a reset transistor coupled between a voltage supply node and the floating diffusion, a read transistor having a source coupled to a voltage bus, and a source follower transistor coupled between the voltage supply node and a drain of the read transistor, where a gate of the source follower transistor is coupled to the floating diffusion. The image sensor also includes a first transistor having a drain coupled to the voltage supply node, and a source configured to be coupled to a current source, and a control transistor coupled between the voltage bus and the source of the first transistor. The image sensor further includes a controller, where the controller is configured to turn off the read transistor and the control transistor, turn on the transfer gate transistor after turning off the read transistor and the control transistor, turn off the transfer gate transistor after turning on the transfer gate transistor, and turn on the read transistor and the control transistor after turning off the transfer gate transistor.

In yet other embodiments, a method of operating a circuit includes floating a voltage bus, where the voltage bus is coupled to a pixel, where the voltage bus is coupled to a current source via a first control switch, where a first node coupled to the current source and the first control switch is coupled to a power supply node via a first transistor, where the pixel includes a photo sensitive element coupled to a drain of a transfer gate transistor, a source follower transistor including a gate coupled to a source of the transfer gate transistor, and a drain coupled to the power supply node, and a read transistor including a drain coupled to a source of the source follower transistor, and a source coupled to the voltage bus, where the floating includes switching off the read transistor and the first control switch. The method also includes while the voltage bus is floating, switching on the transfer gate transistor, and while the voltage bus is floating, switching off the transfer gate transistor after the switching on the transfer gate transistor. The method further includes switching on the read transistor and the first control switch after the switching off the transfer gate transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiments in the present disclosure uses the 4T pixel structure as a non-limiting example. Skilled artisan will appreciate that the concepts and principle of the present disclosure may also be applied to other types of image sensors with different pixels structures and/or different auxiliary circuits without departing from the spirit of the present disclosure.

What is claimed is:

1. A circuit comprising:
   a pixel structure comprising:
      a photo sensitive element;
      a read transistor comprising a first load path terminal coupled to the photo sensitive element, and a second load path terminal coupled to a voltage bus;
   a first transistor comprising a third load path terminal coupled to a power supply node, and a fourth load path terminal configured to be coupled to a current source; and
   a first control switch directly coupled between the voltage bus and the fourth load path terminal of the first transistor.

2. The circuit of claim 1, wherein the pixel structure further comprises:
   a transfer gate transistor coupled between the photo sensitive element and a floating diffusion;
   a reset transistor coupled between the power supply node and the floating diffusion; and
   a source follower transistor coupled between the power supply node and the first load path terminal of the read transistor, wherein a gate of the source follower transistor is coupled to the floating diffusion.

3. The circuit of claim 1, further comprising a second transistor comprising a fifth load path terminal coupled to the power supply node, and an sixth load path terminal coupled to the third load path terminal of the first transistor.

4. The circuit of claim 3, wherein a gate of the second transistor is directly coupled to the fifth load path terminal of the second transistor.

5. The circuit of claim 4, further comprising a third transistor comprising a seventh load path terminal coupled to the power supply node, and an eighth load path terminal coupled to the fourth load path terminal of the first transistor.

6. The circuit of claim 5, further comprising a fourth transistor coupled between the power supply node and the seven load path terminal of the third transistor.

7. The circuit of claim 1, further comprising an analog-to-digital converter (ADC) coupled to the voltage bus.

8. The circuit of claim 1, further comprising a second transistor coupled between the power supply node and the fourth load path terminal of the first transistor.

9. The circuit of claim 8, further comprising a third transistor coupled between the power supply node and the second transistor.

10. The circuit of claim 1, further comprising the current source.

11. The circuit of claim 1, further comprising:
a transfer gate transistor coupled between the photo sensitive element and a floating diffusion;
a reset transistor coupled between the power supply node and the floating diffusion; and
a source follower transistor coupled between the power supply node and the first load path terminal of the read transistor, wherein a gate of the source follower transistor is coupled to the floating diffusion;
a second transistor comprising a fifth load path terminal coupled to the power supply node, and an sixth load path terminal coupled to the third load path terminal of the first transistor, wherein a gate of the second transistor is coupled to the fifth load path terminal of the second transistor;
a third transistor and a fourth transistor coupled in series between the power supply node and the fourth load path terminal of the first transistor;
a fifth transistor and a sixth transistor coupled in series between the power supply node and the fourth load path terminal of the first transistor; and
an analog-to-digital converter coupled to the voltage bus.

12. An image sensor comprising:
a pixel comprising:
a photodiode;
a transfer gate transistor coupled between the photodiode and a floating diffusion;
a reset transistor coupled between a voltage supply node and the floating diffusion;
a read transistor comprising a source coupled to a voltage bus; and
a source follower transistor coupled between the voltage supply node and a drain of the read transistor, wherein a gate of the source follower transistor is coupled to the floating diffusion;
a first transistor comprising a drain coupled to the voltage supply node, and a source configured to be coupled to a current source;
a control transistor coupled between the voltage bus and the source of the first transistor; and
a controller, wherein the controller is configured to:
turn off the read transistor and the control transistor;
turn on the transfer gate transistor after turning off the read transistor and the control transistor;
turn off the transfer gate transistor after turning on the transfer gate transistor; and
turn on the read transistor and the control transistor after turning off the transfer gate transistor.

13. The image sensor of claim 12, wherein the image sensor further comprises an analog-to-digital converter (ADC) coupled to the voltage bus.

14. The image sensor of claim 13, wherein the controller is further configured to:
convert a first voltage on the voltage bus into a first digital data using the ADC before turning on the transfer gate transistor; and
convert a second voltage on the voltage bus into a second digital data using the ADC after turning on the read transistor and the control transistor.

15. The image sensor of claim 14, wherein the controller is further configured to:
turn off the first transistor before converting the first voltage; and
turn on the first transistor after converting the second voltage.

16. The image sensor of claim 14, wherein turning on the read transistor and the control transistor comprises turning on the read transistor and the control transistor simultaneously.

17. The image sensor of claim 16, wherein a first time interval between turning on the read transistor and the control transistor and converting the second voltage is less than about 500 ns.

18. A circuit comprising:
a voltage bus;
a pixel coupled to the voltage bus, wherein the pixel comprises:
a photo sensitive element coupled to a drain of a transfer gate transistor;
a source follower transistor comprising a gate coupled to a source of the transfer gate transistor, and a drain coupled to a power supply node; and
a read transistor comprising a drain coupled to a source of the source follower transistor, and a source coupled to the voltage bus;
a current source coupled to the voltage bus via a first control switch;
a first transistor coupled between the power supply node and a first node, wherein the first node is coupled to the current source and the first control switch; and
a controller coupled to the pixel, the first transistor, and the first control switch, wherein the controller is configured to:
float the voltage bus by switching off the read transistor and the first control switch;
while the voltage bus is floating, switch on the transfer gate transistor;
while the voltage bus is floating, switch off the transfer gate transistor after switching on the transfer gate transistor; and
switching on the read transistor and the first control switch after switching off the transfer gate transistor.

19. The circuit of claim 18, further comprising an analog-to-digital converter (ADC) coupled to the voltage bus and the controller, wherein the controller is configured to:
convert a first voltage on the voltage bus into a first digital value using the ADC before switching on the transfer gate transistor;
convert a second voltage on the voltage bus into a second digital value using the ADC after the switching on the read transistor and the first control switch; and
calculate a different between the first digital value and the second digital value.

20. The circuit of claim 19, wherein the controller is further configured to:
- switch off the first transistor before converting the first voltage; and
- switch on the first transistor after converting the second voltage.

21. The circuit of claim 20, wherein the controller is configured to switch off the read transistor and the first control switch at a first instant of time, and is configured to switch on the read transistor and the first control switch at a second instant of time, wherein the first instant of time is before the second instant of time in a processing cycle of the circuit.

* * * * *